United States Patent
Loo et al.

(10) Patent No.: US 9,040,318 B2
(45) Date of Patent: May 26, 2015

(54) LAMINATION AS A MODULAR APPROACH FOR BUILDING ORGANIC PHOTOSENSITIVE DEVICES

(75) Inventors: Yueh-Lin Loo, Princeton, NJ (US); Jong Bok Kim, Plainsboro, NJ (US)

(73) Assignee: The Trustees of Princeton University, Princeton, NJ (US)

(*) Notice: Subject to any disclaimer, the term of this patent is extended or adjusted under 35 U.S.C. 154(b) by 0 days.

(21) Appl. No.: 13/083,220

(22) Filed: Apr. 8, 2011

(65) Prior Publication Data

US 2011/0250718 A1  Oct. 13, 2011

Related U.S. Application Data

(60) Provisional application No. 61/322,633, filed on Apr. 9, 2010.

(51) Int. Cl.
  H01L 21/00 (2006.01)
  H01L 51/00 (2006.01)
  B82Y 10/00 (2011.01)
  H01L 51/42 (2006.01)

(52) U.S. Cl.
  CPC .......... *H01L 51/0024* (2013.01); *B82Y 10/00* (2013.01); *H01L 51/0023* (2013.01); *H01L 51/0036* (2013.01); *H01L 51/0047* (2013.01); *H01L 51/4246* (2013.01); *H01L 51/4253* (2013.01); *Y02E 10/549* (2013.01)

(58) Field of Classification Search
  CPC .......... H01L 51/0024; H01L 51/0023; H01L 51/4246; H01L 51/0047; H01L 51/0036; H01L 51/4253; Y02E 10/549

USPC .......................................... 136/236; 438/19
  See application file for complete search history.

(56) References Cited

U.S. PATENT DOCUMENTS

| | | | |
|---|---|---|---|
| 6,596,569 B1 | 7/2003 | Bao et al. | |
| 7,557,367 B2* | 7/2009 | Rogers et al. | 257/9 |
| 7,625,596 B2* | 12/2009 | Lewis et al. | 427/66 |
| 7,891,636 B2* | 2/2011 | Zhang et al. | 249/134 |

(Continued)

OTHER PUBLICATIONS

Loo et al., "Soft, conformable electrical contacts for organic semiconductors: High-resolution plastic circuits by lamination." Proceedings of the National Academy of Sciences, Aug. 6, 2002, vol. 99, No. 16, p. 10252-10256.

(Continued)

*Primary Examiner* — William D Coleman
(74) *Attorney, Agent, or Firm* — Meagher Emanuel Laks Goldberg & Liao, LLP

(57) ABSTRACT

There is disclosed a modular lamination approach for processing organic photosensitive devices that allows the individual processing of device components, that once processed are brought together in a final step to make electrical contact. The disclosed method of preparing a laminated photosensitive device having at least one donor-acceptor heterojunction comprises: preparing a top electrode by depositing a functional material on a flexible substrate, such as an elastomer; optionally processing the functional material to obtain desired properties prior to lamination; preparing a bottom portion by depositing a second functional material over a substrate; optionally processing the second functional material to obtain desired properties prior to lamination; and coupling the top electrode to said bottom portion to form a laminated photosensitive device.

27 Claims, 11 Drawing Sheets

(56) References Cited

U.S. PATENT DOCUMENTS

2010/0127247 A1* 5/2010 Yang et al. .................... 257/40
2011/0186112 A1* 8/2011 Aernouts et al. ............. 136/249

OTHER PUBLICATIONS

Zaumseil et al., "Contact resistance in organic transistors that use source and drain electrodes formed by soft contact lamination." Journal of Applied Physics, May 15, 2003, vol. 93, No. 10, p. 6117-6124.
Zaumseil et al., "Nanoscale organic transistors that use source/drain electrodes supported by high resolution rubber stamps." Applied Physics Letters, Feb. 3, 2003, vol. 82, No. 5, p. 793-795.
Guo et al., "High Performance Polymer Light-Emitting Diodes Fabricated by a Low Temperature Lamination Process." Advanced Functional Materials, 2001, 11, No. 5, October, p. 339-343.
Lee et al., "Organic light-emitting diodes formed by soft contact lamination." Proceedings of the National Academy of Sciences, Jan. 13, 2004, vol. 101, No. 2, p. 429-433.
Granström et al., "Laminated fabrication of polymeric photovoltaic diodes." Nature, Sep. 1998, vol. 395, p. 257-260.
Huang et al., "A Semi-transparent Plastic Solar Cell Fabricated by a Lamination Process." Advanced Materials, 2008, 20, p. 415-419.
Kim et al., "The surface engineering of top electrode in inverted polymer bulk-heterojunction solar cells." Applied Physics Letters, 92, 133307-1 to 133307-3, 2008.
Gadisa et al., "Transparent polymer cathode for organic photovoltaic devices." Science Direct, Synthetic Metals, 156, 2006, p. 1102-1107.
Wang et al., "Device Characteristics of Bulk-Heterojunction Polymer Solar Cells are Independent of Interfacial Segregation of Active Layers." Chemistry of Materials, Mar. 17, 2011, p. A-D.
Kim et al., "Reversible Soft-Contact Lamination and Delamination for Non-Invasive Fabrication and Characterization of Bulk-Heterojunction and Bilayer Organic Solar Cells." Aug. 11, 2010, p. 4931-4938.
Yoo et al., "New materials and approaches for solution—processed organic solar cells." May 7, 2009, Igert Seminar, Cornell University.

* cited by examiner

Soft contact lamination for organic solar cells
(independent contact with different annealing sequence)

■ *lamination process*

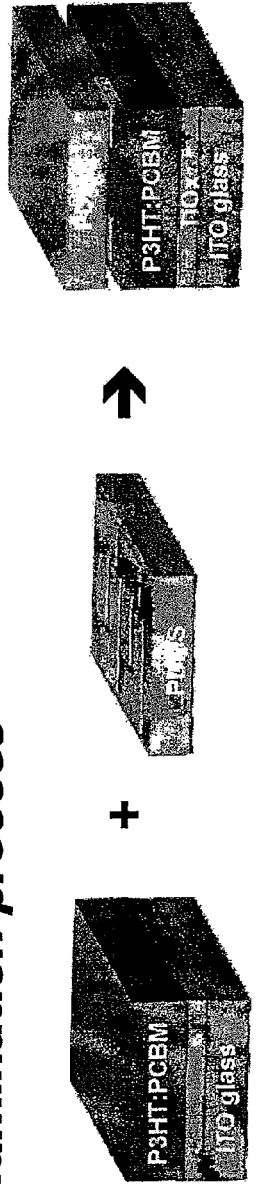

■ *lamination's own merits*

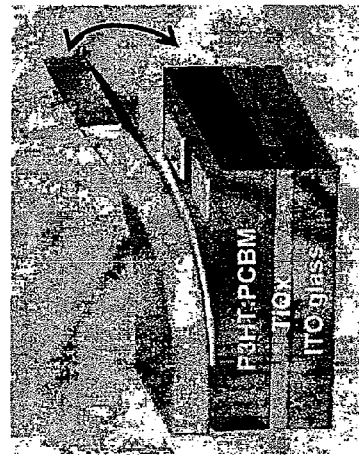

▲ multiple independent electrical connection
  → exact comparison of one material with another under same condition
▲ reversible contact
  → after detaching, possible to examine the interface
▲ R.T process without applied pressure
  → other process without vacuum, such as metal transfer printing (MTP), needs additional pressure & high temperature.
▲ clean interface
  → sometimes metal deposition changes organic surface property.
▲ feasibility of top electrode modification
  → in case of direct deposition, it is impossible.
▲ no solvent or PR damage when PR process is necessary

Figure 8

LAMINATION AS A MODULAR APPROACH FOR BUILDING ORGANIC PHOTOSENSITIVE DEVICES

CROSS REFERENCE TO RELATED APPLICATIONS

This application claims the benefit of U.S. Provisional Application No. 61/322,633, filed on Apr. 9, 2010, which is incorporated by reference as if fully set forth herein.

STATEMENT REGARDING FEDERALLY SPONSORED RESEARCH OR DEVELOPMENT

This invention was made with government support under Grant #DMR-0819860 awarded by the National Science Foundation. The government has certain rights in this invention.

FIELD OF THE DISCLOSURE

The present disclosure generally relates to the fabrication of large-area organic photosensitive devices, such as solar cells, through the use of lamination techniques. The present invention also relates to the high-throughput, large-area combination testing of new materials for organic and polymer photosensitive devices. The present invention further relates to the development of more robust, more reliable and higher efficiency photosensitive devices, having low fabrication costs.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max}V_{max}\}/\{I_{SC}V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \Psi S_0^*$. Here $S_0$ and $S_0^*$ denote ground and excited molecular states, respectively. This energy absorption is associated with the promotion of an electron from a bound state in the highest occupied molecular orbital (HOMO) energy level, which may be a B-bond, to the lowest unoccupied molecular orbital (LUMO) energy level, which may be a B*-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cell, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photo-generation process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F ~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low external quantum efficiency (electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50 Å$) than the optical absorption length (~500Å), requiring a trade-off between using a thick, and therefore resistive, cell with multiple or highly folded interfaces, or a thin cell with a low optical absorption efficiency.

Flexible circuits that combine plastic substrates and printing techniques with new classes of organic, hybrid organic/inorganic, or solution-derived inorganic semiconductors represent important emerging technologies. These "plastic" circuits have attractive characteristics that are difficult to achieve with materials and methods used for conventional electronics: they are mechanically flexible, durable, and lightweight, and they can be printed over large areas. They also have the potential to be ultralow in cost partly because they are compatible with continuous, high-speed reel-to-reel fabrication techniques. As a result, plastic circuits will form the foundations for future devices-electronic paper, wearable sensors, low-cost smart cards and radio frequency identification tags, flexible arrays of plastic microphones, and the like, that will compliment the types of systems that established electronics supports, such as microprocessors, and high-density memory.

Recent results demonstrate several promising combinations of materials and patterning techniques for small-scale (several transistors) to medium-scale (several hundred transistors) plastic circuits. These systems, however, are fabricated in a general approach that was borrowed from conventional silicon microelectronics: they are built by depositing and patterning one layer of material after another on a single substrate. Designing sets of chemically compatible solution-processable materials that can be reliably deposited on top of plastic substrates and on top of one another in this layer-by-layer approach is challenging.

Requirements that follow from this fabrication strategy often lead to transistor and circuit geometries that are not optimized for electrical performance. Similar concerns make it difficult to incorporate designs that improve the mechanical flexibility of the circuits. Efficient and general means for encapsulating the devices are also lacking; their environmental stability is, as a result, typically poor or unknown.

For the lack of better processing, organic and plastic solar cells are made using different methodologies, such as, for example, those described above for making inorganic devices. These approaches call for the use of harsh chemicals, such as strong acids, bases, and organic solvents. In addition, processing is frequently carried out at elevated temperatures. Given that organic and polymeric materials differ significantly in physical properties, these processes are not conducive for making optimal organic and polymeric devices. Thus, there remains a need to develop a more reliable and highly efficient method for generating organic and organic photosensitive devices, such as plastic solar cells.

SUMMARY OF THE INVENTION

The present disclosure relates to a modular lamination approach for processing organic photosensitive devices that allows the individual processing of device components, layers or materials. Once processed these individually processed components, layers or materials can be brought together in a lamination step to make electrical contact. By this method, organic semiconductive materials (both polymer and small-molecular) that are otherwise frequently mechanically and chemically fragile are no longer subjected to the harsh processing environments required to define the metal electrodes of the devices. In addition, since organic photosensitive devices (e.g., solar cells) comprise a donor-acceptor heterojunction photoactive layer/layers and other layers, the disclosed method also allows the optimization of the photoactive layer, or other non-photoactive layers, utilizing potentially drastically different processing conditions if necessary. Further, for tandem or stacked organic photovoltaic devices comprising multiple sub-cells each comprising a donor-acceptor heterojunction, this approach allows for the separate processing and optimization of the individual subcells or groups of subcells, or other layers, prior to lamination to form a completed device. Decoupling the processing of individual components, layers or materials according to the present disclosure provides for the fabrication of more robust, more reliable, and higher efficiency devices through the optimization of processing for each of the components, materials, layers, subcells and/or devices.

In one embodiment, there is disclosed a method for preparing a laminated photosensitive device having at least one photoactive donor-acceptor heterojunction, the method comprising:

preparing a first portion comprising a first electrode by depositing at least one functional material over a flexible substrate;

preparing a second portion over a second substrate, the second portion optionally comprising at least one of a second electrode, an additional functional material, or both;

wherein at least one processing step is performed on at least one of the first functional material, the second functional material or one of the first or second electrode to obtain desired properties prior to lamination; and coupling said first portion to the second portion to form a laminated photosensitive device.

In another embodiment, the present disclosure relates to a method or process for the deposition of at least one functional material over one or more elastomeric substrates. For example, functional materials may be appropriately processed and then laminated against another portion comprising the remaining functional materials to form a photosensitive device, such as an organic solar cell. The functional materials on the bottom portion may also be appropriately processed to obtain the desirable qualities prior to lamination.

Aside from the subject matter discussed above, the present disclosure includes a number of other exemplary features such as those explained hereinafter. It is to be understood that both the foregoing description and the following description are exemplary only.

BRIEF DESCRIPTION OF THE DRAWINGS

FIG. 8 is an exemplary sketch of one process according to the disclosed invention.

DETAILED DESCRIPTION OF THE INVENTION

Figure 1:
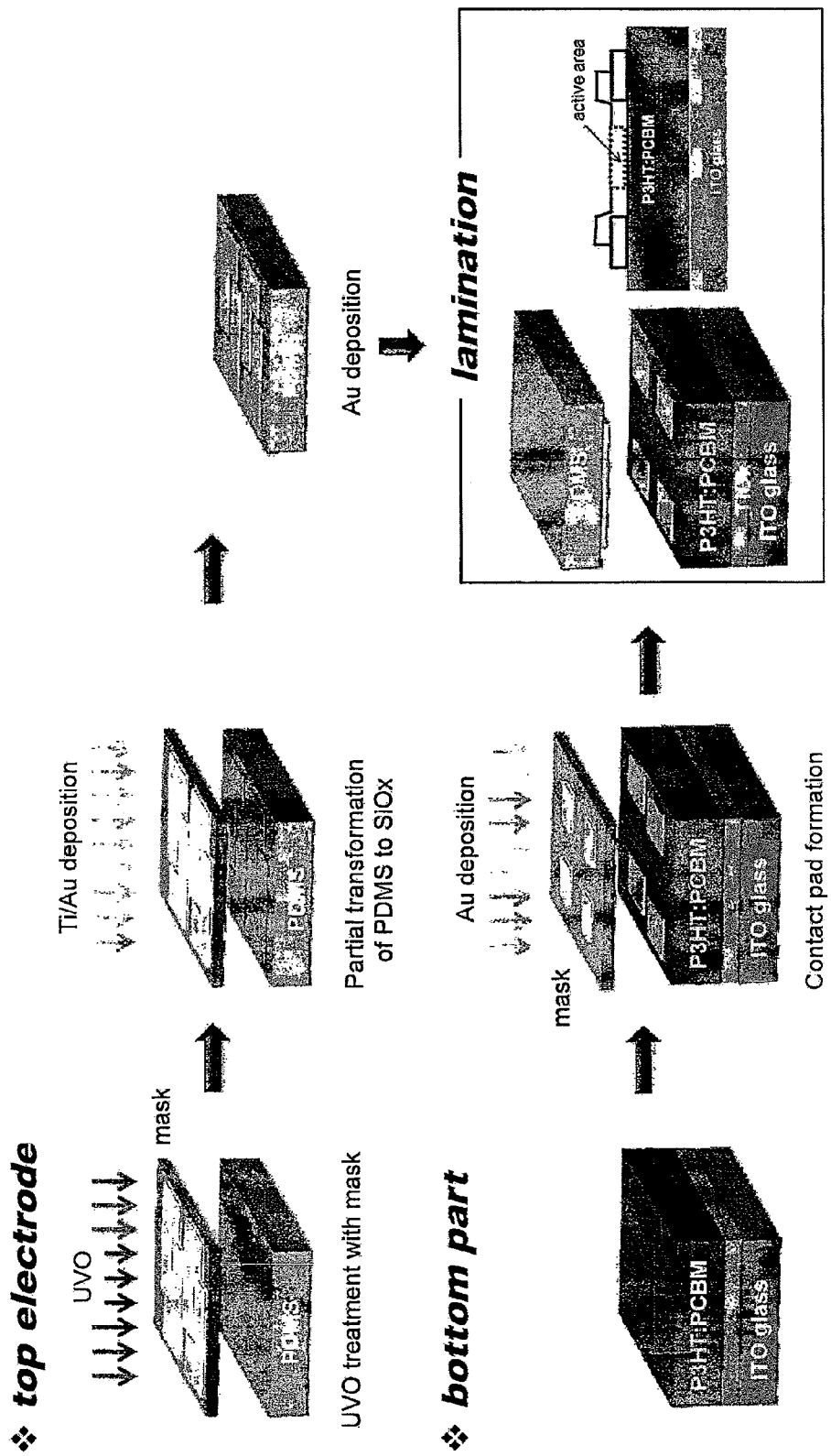
FIG. 1 is a schematic illustration of the soft-contact lamination process employed to fabricate organic solar cells. To create the top electrode, PDMS is selectively treated by UV/Ozone through a stencil mask, followed by Au deposition using the same stencil mask. The bottom portion of the device consists of prepatterned ITO on glass, onto which TiOx, P3HT:PCBM and the contact pads are deposited. Physical lamination completes device fabrication.

As used herein, a "laminate" refers to a material constructed by uniting two or more layers of material together. The process of creating a laminate is referred to as "lamination."

As used herein, a "functional material" refers to a material that exhibits at least one desired function. Non-limiting examples of such materials are those that form, for example, a smoothing layer, a donor—acceptor heterojunction, an exciton blocking layer, a charge carrier blocking layer, a donor layer, an acceptor layer, a charge transfer layer, a charge recombination layer or zone and an electrode other than the anode and cathode.

The method described herein provides many practical advantages. Non-limiting examples of such advantages include the ability (i) to separate many of the patterning and deposition steps, (ii) to enable the annealing or other performance optimizing processing of the active regions of a organic photovoltaic device, layer or interface, and (iii) to enable performance enhancing processing (e.g., annealing of a donor-acceptor heterojunction to maximize EQE) of individual sub-cells, layers or interfaces of a tandem or stacked organic photovoltaic device (e.g. solar cell).

In one embodiment, the disclosed method comprises preparing a laminated photosensitive device having at least one donor-acceptor heterojunction, the method comprising: preparing a first portion having at least one first electrode by depositing at least one functional material on a flexible substrate, such as an elastomer, including polydimethylsiloxane (PDMS). The PDMS may be in the form of a pad that is prepared by mixing a PDMS prepolymer and a curing agent.

The method next comprises optionally processing the functional material to obtain desired properties prior to lamination. As used herein, "processing" includes any post deposition treatment, including but not limited to thermal annealing and exposure to solvent vapors. Such post deposition treatments are typically (but not solely) used to change the structure of the functional material to make it more crystalline, for example.

The method further comprises preparing a second portion by depositing at least one functional material, such as a photoactive material or device, on at least one substrate. In one embodiment, the second portion may further comprise ITO on a glass or plastic substrate, wherein the substrate is exposed to UV/ozone.

The disclosed method may further comprise processing the functional material, such as comprising a photoactive material or materials, to obtain desired properties prior to lamination. As previously indicated, "processing" is optional and encompasses any post deposition treatment, including but not limited to thermal annealing and exposure to solvent vapors.

To complete the process, a first electrode on the first portion is coupled to the second portion to form a laminated photosensitive device. The coupling is typically performed such that the interface between the first electrode of the first portion and second portion is substantially free of air bubbles. As used herein, "substantially free of air bubbles," means free of any noticeable or measurable air bubbles. In one embodiment, the coupling is performed under ambient temperature with or without extraneous heat and/or pressure. It is also understood that the coupling may be performed after annealing the photoactive layer at an appropriate temperature followed by lamination with the first electrode. It is also appreciated that the recitation herein of "first" and "second" electrode does not preclude the use of additional electrodes, such as in the fabrication of devices comprising more than three or more electrodes.

It is understood that at least a portion of the flexible substrate may be treated to provide a deposition surface, such as one containing at least one functional material. In one embodiment, the deposition surface comprises a conducting material that is deposited on a deposition surface that is prepared or treated by exposing the flexible substrate to UV/ozone.

Any conducting material traditionally used in similar applications can be used in the disclosed process. Non-limiting examples of the at least one conducting material that can be deposited on the deposition surface include metals, such as Ti, Au, Al, Sn, and Ag, metal oxides, carbon nanotubes, conducting polymers, or mixtures thereof.

In some embodiments, the photoactive layer may comprise small molecules, polymers, or mixtures thereof. Non-limiting examples of such materials include poly(3-hexylthiophene), [6,6]-phenyl-C61-butyric acid methyl ester, and poly{[n,n'-bis(2-octyldodecyl)-naphthalene-1,4,5,8-bis(dicarboximide)-2,6-diyl]-alt-5,5'-(2,2'-bithiophene)}, or mixtures thereof, and wherein the photoactive layer is deposited on said titanium electron transport layer.

"Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Non-limiting examples of such small molecule materials include: CuPc, $C_{60}$, $C_{70}$, SubPc, Squaraines, AlClPc, SnPc, and others.

In another embodiment, the photoactive layer comprises poly(3-hexylthiophene)/[6,6]-phenyl-C61-butyric acid methyl ester and poly(3-hexylthiophene)/poly{[n,n'-bis(2-octyldodecyl)-naphthalene-1,4,5,8-bis(dicarboximide)-2,6-diyl]-alt-5,5'-(2,2'-bithiophene)}.

It is understood that the photoactive layer further comprises electrical contacts electrically connected to the photoactive layer surface. For example, the electrical contacts may be chosen from Ag contact pads or Au contact pads.

In another embodiment, the disclosure relates to a method for preparing a laminated photosensitive device, the method comprising:
providing a first substrate comprising an elastomeric material;
depositing at least one conducting material on the elastomeric material to form a first portion comprising a first electrode;
processing the first electrode with at least one pre-lamination treatment step;
providing a second substrate;
depositing a functional material, such as one that forms a photoactive layer, on the second substrate to form a second portion;
processing the second portion with at least one pre-lamination step; and
coupling the first portion with the second portion.

In another embodiment, the disclosure relates to a method for preparing a laminated photosensitive device, the method comprising,
preparing a first portion, the method comprising:
providing a PDMS substrate prepared from mixing PDMS pre-polymer and
a curing agent;
exposing the PDMS substrate to UV/ozone to provide a deposition surface;
depositing at least one conducting material chosen from Ti and Au onto the deposition surface;
preparing a second portion comprising:
poly(3-hexylthiophene)/[6,6]-phenyl-C61-butyric acid methyl ester or
poly(3-hexylthiophene)/poly{[n,n'-bis(2-octyldodecyl)-naphthalene-1,4,5,8-bis(dicarboximide)-2,6-diyl]-alt-5,5'-(2,2'-bithiophene)}, and electrical contacts chosen from Ag contact pads or Au contact pads; and
coupling the first portion comprising the PDMS pad with second portion under ambient temperature with or without extraneous pressure, wherein the coupling is performed such that the interface between the PDMS pad and the second portion is substantially free from air bubbles.

In another embodiment, the disclosure relates to a method for preparing a multi-junction photosensitive device, the method comprising:
preparing at least one first photosensitive device comprising,
providing a first substrate comprising an elastomeric material;
depositing at least one conducting material on the elastomeric material to form a first portion comprising a first electrode;
processing the first portion comprising the first electrode with at least one pre-lamination treatment step;
providing a second substrate;
depositing a functional material, such as one that forms a photoactive layer, on the second substrate to form a second portion;
processing the second portion with at least one pre-lamination step;
coupling the first portion comprising a first electrode with the second portion to form the first photosensitive device; and
preparing at least one second photosensitive device comprising,
providing a third substrate comprising an elastomeric material;
depositing at least one conducting material on the elastomeric material to form a third portion comprising a third electrode;
processing the third electrode with at least one pre-lamination treatment step;
providing a fourth substrate;
depositing a photoactive material on the fourth substrate to form a fourth portion;
processing the fourth portion with at least one pre-lamination step;
coupling the third portion with the fourth portion to form a second photosensitive device, wherein the coupling conditions for the first portions and the second portions of the first photosensitive device and the third portions and fourth portions of the second photosensitive device may be the same or different; and coupling the first photosensitive device with the second photosensitive device.

In one embodiment, there is disclosed an inverted device architecture that exhibits excellent air stability. FIG. 1 schematically illustrates the lamination process for constructing bulk heterojunction organic solar cells according to this embodiment. For example, in this embodiment, there is disclosed a transparent substrate that supports the bottom electrodes onto which the active layer is deposited, and an independent elastomeric substrate that supports the top electrodes. The bottom substrate may be prepared by first patterning transparent electrodes, such as indium tin oxide (ITO) electrodes on glass or plastic via photolithography. Unlike devices constructed in the conventional architecture, ITO electrodes serve as cathodes to collect electrons in the disclosed devices.

In one embodiment, an inorganic layer can be formed on the surface of the patterned electrodes. This can be done by depositing and subsequently drying a solution comprising the inorganic material on the electrode surface. For example, in one embodiment, an alcohol-based solution of titanium can be deposited onto an electrode surface followed by hydrolysis of the precursor at room temperature and subsequent annealing to produce a titania layer. This titania layer serves two roles: it acts as a buffer layer to smooth out the rough ITO surface and it also blocks hole transport, effectively increasing the rectification ratio of the fabricated devices. Next, a layer acting as an electron donor and electron acceptor, which makes up the active layer, can be deposited. Deposition of gold contact pads onto which the top electrodes will subsequently laminate against completes the fabrication of the bottom portion of the device.

As shown in FIG. 1, the top substrate consists of gold electrodes, patterned by direct evaporation through a stencil mask, on crosslinked poly(dimethyl siloxane), PDMS. Given the inverted architecture of this embodiment, the top electrode may encompass a variety of materials. For example, gold may be used as the high work function anode to collect holes during device operation. Prior to gold evaporation, the PDMS substrate may be selectively treated by UV/Ozone through the same stencil mask that is used to define the top electrodes. This process converts the exposed regions of PDMS to a silica-like surface and thus decreases thermal expansion and shrinkage during evaporation, effectively eliminating cracks in the subsequently deposited gold electrodes. Silver electrodes have also been fabricated on the top substrate in an analogous fashion. When oxidized, silver oxide exhibits a comparable work function to gold. Thus, it is possible to employ oxidized silver as anodes in inverted organic solar cells to collect holes.

Still referring to FIG. 1, with the fabrication of the bottom and top substrates complete, these two portions are gently brought together at room temperature. Physical contact is initiated from one corner of the PDMS substrate and the pad is gently laid down against the active layer to avoid trapping of air bubbles at the laminated interface. No external pressure is required to establish contact. In this embodiment, the top PDMS substrate can supports five sets of electrodes; lamination against the bottom substrate thus yields an array of five inverted organic solar cells.

The invention will be further clarified by the following non-limiting examples, which are intended to be purely exemplary of the invention.

EXAMPLES

Example 1

Au Lamination (Bulk Heterojunction Device)

The laminated device comprised the following two parts, a first portion that contained the first electrode and a second portion that contained the second electrode as well as the donor-acceptor active layer. These two parts were prepared independently, as shown in FIG. 1, and described in more detail below.

First, a first portion, which contained a first electrode, a polydimethylsiloxane (PDMS) pad was prepared by mixing PDMS prepolymer and curing agent (Sylgard 184A and B, Dow corning) at 10:1 mass ratio and curing at 65° C. during overnight. The cured PDMS was then precut to size and selectively treated by exposure to UV/Ozone through a stencil mask with openings that define the first electrodes. A 60 minute exposure converted the exposed PDMS surface to silica. This process decreased the thermal expansion coefficient of PDMS in the regions of first electrode deposition, effectively eliminating cracks in the subsequently deposited gold. Titanium and gold were then deposited by e-beam evaporation through the same stencil mask to create the first electrodes in the UV/ozone exposure regions. The thicknesses of titanium and gold were 1 nm and 50 nm, respectively. In case of silver electrodes, silver was deposited by thermal evaporation without prior deposition of titanium. The thickness of silver electrodes was the same as gold electrodes. In this example, the first electrodes can be referred to as the "top portion" or the "top electrodes."

To fabricate the second portion of the device, pre-patterned ITO on glass substrates (15 Ω/cm, Colorado Concept Coatings) were first cleaned by ultra-sonication for 10 minutes each in acetone and isopropyl alcohol (IPA). After rinsing in deionized (DI) water, the pre-patterend ITO substrates were exposed to UV/Ozone for 10 minutes. A 1 wt % titanium isopropoxide (Ti[OCH]$(CH_3)_2]_4$, Aldrich 99.999%) precursor in isopropyl alcohol solution was then spin coated on the substrates at 4500 rpm for 30 seconds. Hydrolysis of the precursor at room temperature for 1 hour and at 170° C. for 10 minute yielded a 30 nm thick titania electron transport layer.

Poly(3-hexylthiophene) (P3HT, Merck Chemicals Ltd.) and [6,6]-phenyl-C61-butyric acid methyl ester (PCBM, American Dye Source Inc.) were dissolved at a 1:1 mass ratio in chlorobenzene yielding a 2.4 wt % solution. The co-solution was then spin coated on the titania layer at 500 rpm for 60 seconds to yield a photoactive layer that was 180 nm thick. 18 nm thick Au contact pads were then deposited directly on the photoactive layer. In this example, the second portion can be referred to as the "bottom portion."

When the top and bottom portions of the devices were brought together, the top electrodes were contacted directly to the gold contact pads on the photoactive layer; the gold contact pads thus served as the probing electrodes in the setup. When the ITO was pre-patterned to include contact pads for lamination, the deposition of Au contact pad on the photoactive layer was unnecessary.

Next, the top and bottom portions were brought together to complete the circuit and establish electrical contact. Contact was initiated from one corner of the PDMS pad; the pad was then gradually laid down on the bottom element to avoid any trapping of air bubbles at the interface between the top and bottom elements. Gentle pressure was applied on the PDMS pad upon contact to remove residual trapped air at the interface. The photoactive layer in the second portion was annealed at 130° C. or 170° C. for 1 minute before the top element was laminated against it. The active area of completed device was 0.18 cm².

Example 2

Current-Density Voltage Characteristics (J-V) of Device Made According to Example 1

FIGS. 2a and 2b show the current density-voltage (J-V) characteristics of an organic solar cell made according to example 1, with several different laminated top electrodes in the dark and under illumination. In this example, an array of gold electrodes was deposited on an active layer that had been previously annealed at 170° C. to complete the organic solar cells. The J-V characteristics of a representative device are illustrated with open squares. Of the five devices tested, they all showed reasonable rectification ratios (of order $10^3$) when the diodes were operated in the dark. Under illumination, the same devices exhibit an average open-circuit voltage ($V_{oc}$) of $-0.56 \pm 0.01$ V, an average short-circuit current density ($J_{sc}$) of $6.96 \pm 0.62$ mA/cm² and an average fill factor of $0.53 \pm 0.03$, resulting in an average efficiency of $2.03 \pm 0.29\%$. Because these devices were collecting electrons at the ITO cathode and holes at the gold anode during operation of the inverted solar cells, power generation occurred in the second quadrant of the J-V graph with a negative $V_{oc}$ and positive $J_{sc}$.

For comparison, devices constructed in the conventional architecture exhibit power generation curves in the fourth quadrant: a positive $V_{oc}$ and a negative $J_{sc}$ were recorded. To test the robustness of the disclosed lamination process, the top PDMS substrate supporting the first set of gold electrodes was removed and replaced with a second array of gold electrodes. The J-V characteristics of the solar cell comprising the same active layer but a newly laminated gold electrode are shown as open circles in FIG. 2. The diode characteristics in the dark were comparable to those of the same device with the prior set of gold electrodes. Testing the same five devices under illumination yielded an average $V_{oc}$ of $-0.56 \pm 0.01$ V, an average $J_{sc}$ of $6.93 \pm 0.63$ mA/cm² and an average fill factor of $0.53 \pm 0.01$. Accordingly, the average efficiency of such a device was $2.07 \pm 0.18\%$.

That the device characteristics were unchanged with the replacement of laminated electrodes is a strong indication that efficient electrical contact has been reestablished. The J-V characteristics are thus a reflection of the active layer and are not limited by contact effects at the active layer-top electrode interface. Finally, the second array of gold electrodes was removed and replaced with an array of silver electrodes; the J-V characteristics associated with the same device, but now with a silver electrode, are shown as open triangles in FIG. 2. The diode characteristics obtained in the dark are again largely comparable with the device tested prior. Repeated testing of the five devices under illumination resulted in an average $V_{oc}=-0.56 \pm 0.01$ V, $J_{sc}=7.11 \pm 0.33$ mA/cm², fill factor=$0.51 \pm 0.03$ and an average efficiency of $2.02 \pm 0.26\%$. The J-V characteristics are comparable to those obtained on the devices when they were laminated with gold electrodes since oxidized silver has a work function that is comparable to gold.

Figure 2:
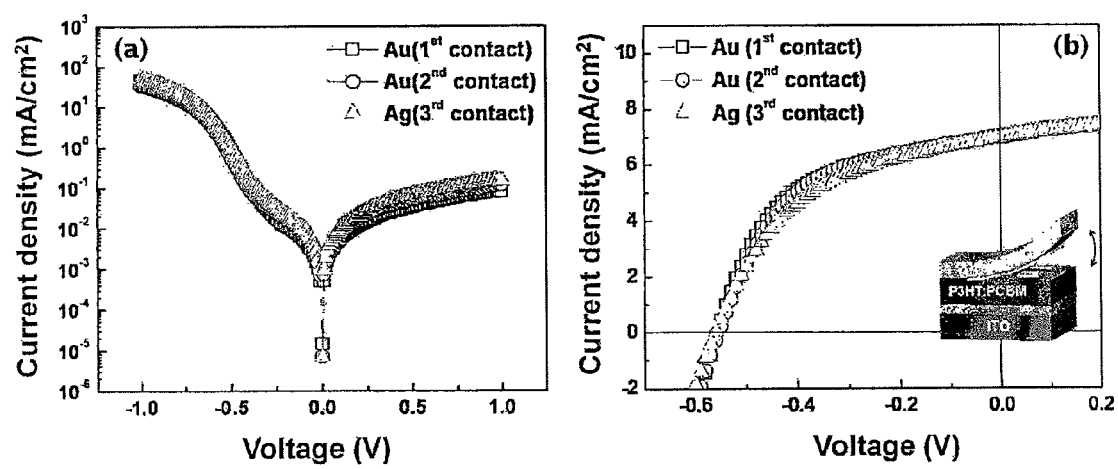
FIG. 2 illustrates J-V characteristics of inverted solar cells with several different laminated top electrodes on the same active layer (a) in the dark and (b) under illumination (100 mW/cm$^2$). The active layer was thermally annealed at 170° C. for 1 min prior to lamination. After testing, the gold electrodes were removed and replaced with new sets of gold and silver electrodes for further testing.

The results summarized in FIG. 2 indicate the disclosed process to be a robust method of establishing efficient electrical contact to organic layers in solar cells. Multiple top electrodes can be laminated reversibly against the same active layer for testing. The modularity of this process thus affords new opportunities for engineering the charge transfer interface between the organic active layer and the top electrodes. Specifically, with laminated organic solar cells, it has been shown that the presence of adlayers on the top electrode influences device characteristics. These experiments—previously not possible with devices constructed in the bottom-up approach—are uniquely enabled by the disclosed method's ability to laminate, non-destructively remove, and then subsequently relaminate top electrodes to the same active layer.

The ability to non-destructively remove the top electrode after device fabrication and testing has also enabled the examination of the morphological development of the once-buried active layer. Because the active layer has traditionally been difficult to access, improvements in solar cell performance observed with thermal annealing after top electrode deposition have frequently been attributed to increases in crystallinity of the organic semiconductors. This inference is based on structural characterization of thin organic films that have been subjected to processing histories comparable to those of active layers in solar cells, but in the absence of the top electrodes. Given that the structure of active layers, and hence the device performance, can be highly dependent on the details of processing, morphological characteristics of thin films annealed in the absence of the top electrode may not be representative of those in actual devices where the active layers are frequently annealed after electrode deposition.

Example 3

P3HT/Au Lamination (Bilayer Device)

The fabrication of devices with planar or bilayer donor-acceptor heterojunction architecture using P3HT/PCBM or P3HT/poly{[N,N'-bis(2-octyldodecyl)-naphthalene-1,4,5,8-bis(dicarboximide)-2,6-diyl]-alt-5,5'-(2,2'-bithiophene)} (P(NDI2OD-T2, Polyera ActiveInk N2200) photoactive layers was also based on the disclosed lamination procedure.

To make devices with bilayer or planar heterojunction structures, the donor and acceptor material were independently coated on the top element comprising gold electrodes and the bottom element comprising the electron transport layer (TiOx) on pre-patterned ITO/glass, respectively. Specifically, after preparing TiOx layer on ITO glass, PCBM or P(NDI2OD-T2) in chlorobenzene was spin coated on TiOx substrate to yield electron accepting layers of 40 and 150 nm thick, respectively. Uniformly coating P3HT on the top element, however, was more challenging due to the coexistence of hydrophobic PDMS regions and hydrophilic Au regions. Thus, a polymer transfer technique was employed for the deposition of P3HT on the top element. To transfer P3HT onto the gold electrodes defined on PDMS, P3HT was first coated on UV/Ozone treated glass substrates. An Au/PDMS stamp was then brought into contact with P3HT and then entire assembly soaked in water for 5 min. Water selectively wicked into the P3HT/glass interface causing delamination of P3HT from the glass substrate and its transfer onto Au/PDMS. The lamination of P3HT with Au/PDMS on PCBM [or P(NDI2OD-T2)]/TiOx substrate completed the device. This example allowed for unique methods of fabricating bilayer structures that cannot typically be fabricated in a bottom-up approach due to solvent incompatibility issues.

Example 4

Device Characteristics of P3HT:PCBM Inverted Solar Cell

Figure 3:
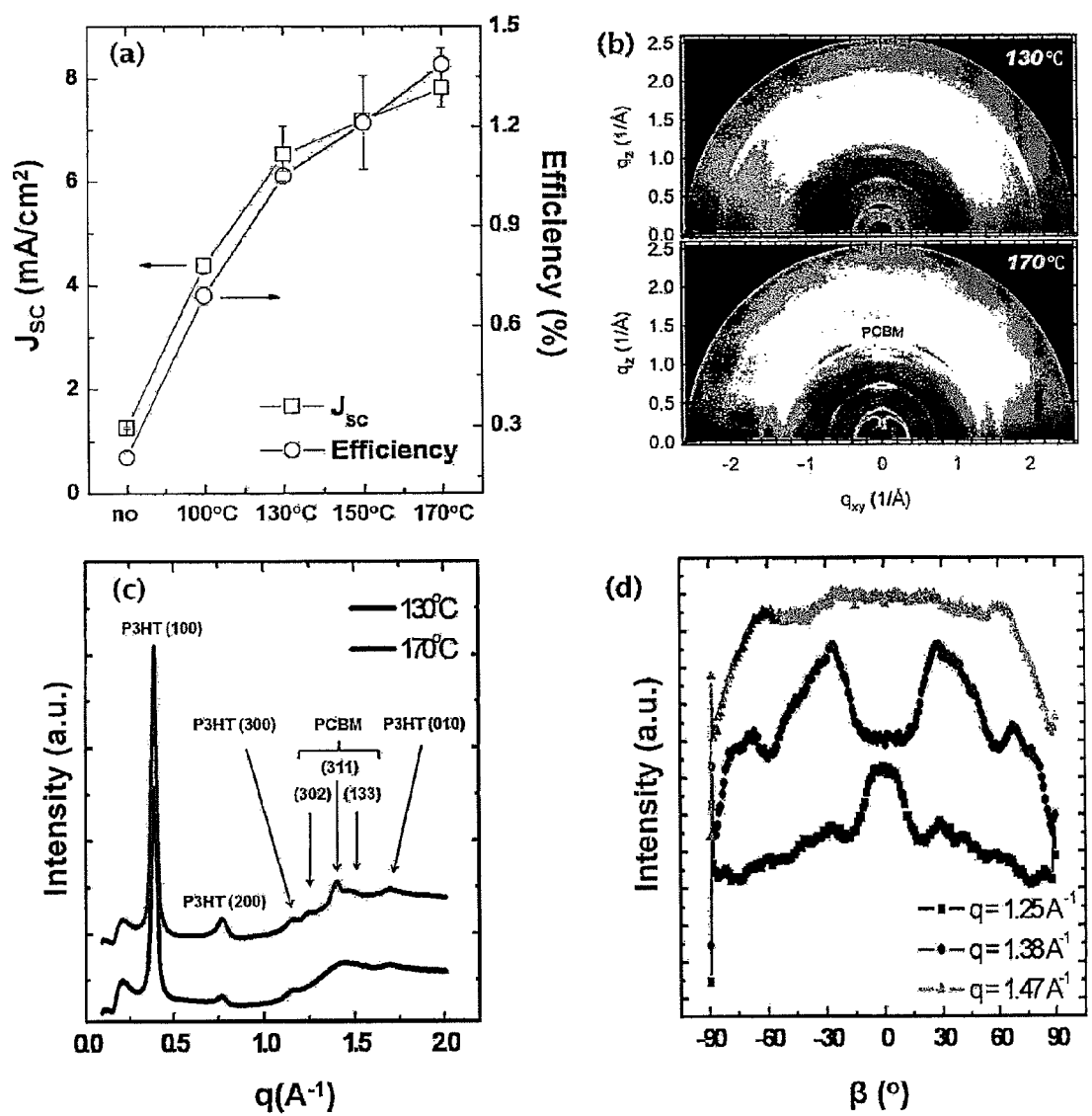
FIG. 3 (a) illustrates the device characteristics ($J_{SC}$, efficiency) of P3HT:PCBM inverted polymer solar cells that were annealed at different temperatures after top electrode lamination; (b) grazing-incidence x-ray diffraction patterns acquired on once-buried active layers in devices that were annealed at 130 and 170° C.; (c) one-dimensional x-ray profiles generated by azimuthally averaging across the x-ray patterns shown in (b); (d) azimuthal line traces of the PCBM reflections generated from the x-ray pattern of the active layer that was annealed at 170° C.

This Example shows that the versatility of the disclosed method, it was possible to directly elucidate the structure of the active layer in functional organic solar cells. In FIG. 3a, the increases in $J_{sc}$ (open squares; left y-axis) and device efficiency (open circles; right y-axis) of P3HT:PCBM inverted bulk-heterojunction solar cells with post-device fabrication thermal annealing were quantified. Without any thermal annealing of the active layer, the $J_{sc}$ averages 1.26±0.02 mA/cm² for five devices. Subjecting similarly prepared devices to thermal annealing after top electrode deposition progressively increased $J_{sc}$; devices that were thermally annealed at 170° C. exhibit an average $J_{sc}$ of 7.81±0.37 mA/cm². This increase in $J_{sc}$ is reflected in a concomitant increase in device efficiency; the average device efficiency increases from 0.21±0.02% for unannealed devices to 1.39±0.05% for devices that were annealed at 170° C. after top electrode deposition.

In this example, thermal annealing after top electrode deposition always resulted in increases in Jsc and device efficiency; this trend is observed for devices both with laminated and with directly evaporated top gold electrodes. While directly evaporated top electrodes cannot be easily removed after device testing without inducing physical damage to the active layer, the laminated electrodes can be non-invasively peeled away to reveal the once-buried active layer for subsequent structural characterization.

The top and bottom portions of FIG. 3b show grazing-incidence x-ray diffraction (GIXD) images acquired on active layers after removal of laminated top electrodes from organic solar cells that had been thermally annealed at 130° C. and 170° C., respectively. These experiments were carried out on Beamline 11-3 at the Stanford Synchrotron Radiation Laboratory. The lamella or (h00) reflections of P3HT at q (scattering vector) of 0.37 Å⁻¹, 0.74 Å⁻¹, and 1.11 Å⁻¹ were labeled for clarity. Also labeled is the broad reflection at 1.4 Å⁻¹ that is associated with PCBM.

The P3HT (h00) reflections are more intense at the meridian compared to the equator, an indication that P3HT crystals were preferentially oriented with the (h00) planes parallel to the substrate. Given the crystal structure of P3HT, this preferential orientation necessitated the conclusion that π-stacking of P3HT in the active layers was largely in plane. Comparing the x-ray diffraction patterns revealed that the P3HT (h00) reflections were significantly stronger and better defined for the device annealed at 170° C. Even more striking was the difference in the PCBM scattering. The diffraction pattern acquired on the active layer when the device was subjected to thermal annealing at 130° C. revealed a broad and diffuse PCBM reflection, which showed that the PCBM was amorphous. This reflection sharpened significantly in the diffraction pattern acquired on the active layer annealed at 170° C., which showed that the PCBM was, at least partly, crystalline. Further, it was observed that the intensities of the sharper PCBM reflections were non-uniform azimuthally; enhanced intensities off the meridian suggest that the PCBM crystallites were preferentially oriented when the device was annealed at 170° C.

To compare the P3HT and PCBM microstructures and crystallinities between the two active layers, the x-ray patterns were azimuthally averaged across to obtain the one-dimensional x-ray profiles shown in FIG. 3c. The reflections associated with P3HT and PCBM were labeled for clarity. The diffraction profile acquired on the active layer that was annealed at 170° C. revealed significantly stronger and more pronounced P3HT (h00) reflections (at 0.37 Å⁻¹, 0.74 Å⁻¹, and 1.11 Å⁻¹) compared to that of the active layer annealed at 130° C. While the GIXD data obtained do not allow construction of complete pole figures and a comparison of total integrated intensities that were necessary for accurate assessment of crystallinity, the data in FIG. 3c do suggest that P3HT was more crystalline for annealing at 170° C. This conclusion was supported by the observation of the P3HT (010) reflection in the x-ray profile extracted from the active layer annealed at 170° C., which is much less prominent than for the active layer annealed at 130° C.

The x-ray scan acquired on the active layer at 130° C. revealed a broad reflection centered at 1.4 Å⁻¹ that is characteristic of amorphous PCBM. Annealing the active layer at 170° C. sharpened the PCBM reflections significantly. Three reflections were observed that are associated with the triclinic crystal structure of PCBM. Given the published lattice constants and angles of the triclinic unit cell, the following three peaks were identified: (302) reflection at 1.25 Å⁻¹, the (311) reflection at 1.38 Å⁻¹ and the (133) reflection at 1.47 Å⁻¹ of PCBM.

Example 5

Current Density-Voltage Characteristics (J-V) Laminated (a) P3HT/PCBM and (b) P3HT/P(NDI2OD-T2) Bilayer Organic Solar Cells with Varying Layer Thicknesses To demonstrate the versatility and modularity of the disclosed process, bilayer organic solar cells were constructed by laminating the polymer electron donor material layer against the electron acceptor material layer. This concept was demonstrated with two pairs of electron donor and electron acceptor materials, the first pair comprising P3HT and PCBM while the second pair comprised P3HT and a polymer electron acceptor of poly{[N,N'-bis(2-octyldodecyl)-naphthalene-1,4,5,8-bis(dicarboximide)-2,6-diyl]-alt-5,5'-(2,2'-bithiophene)}, or P(NDI2OD-T2). Because P3HT and PCBM (as well as P3HT and P(NDI2OD-T2)) are soluble in solvents with comparable polarities, bilayer organic solar cells comprising these material combinations could not be constructed via sequential deposition of the organic semiconductors since the solvent that was used to deposit the top layer would erode the underlying organic semiconductor. With the disclosed process, the electron donor can be deposited on the top elastomeric substrate while the electron acceptor was deposited on the bottom substrate before the two portions were brought into contact.

Figure 4:
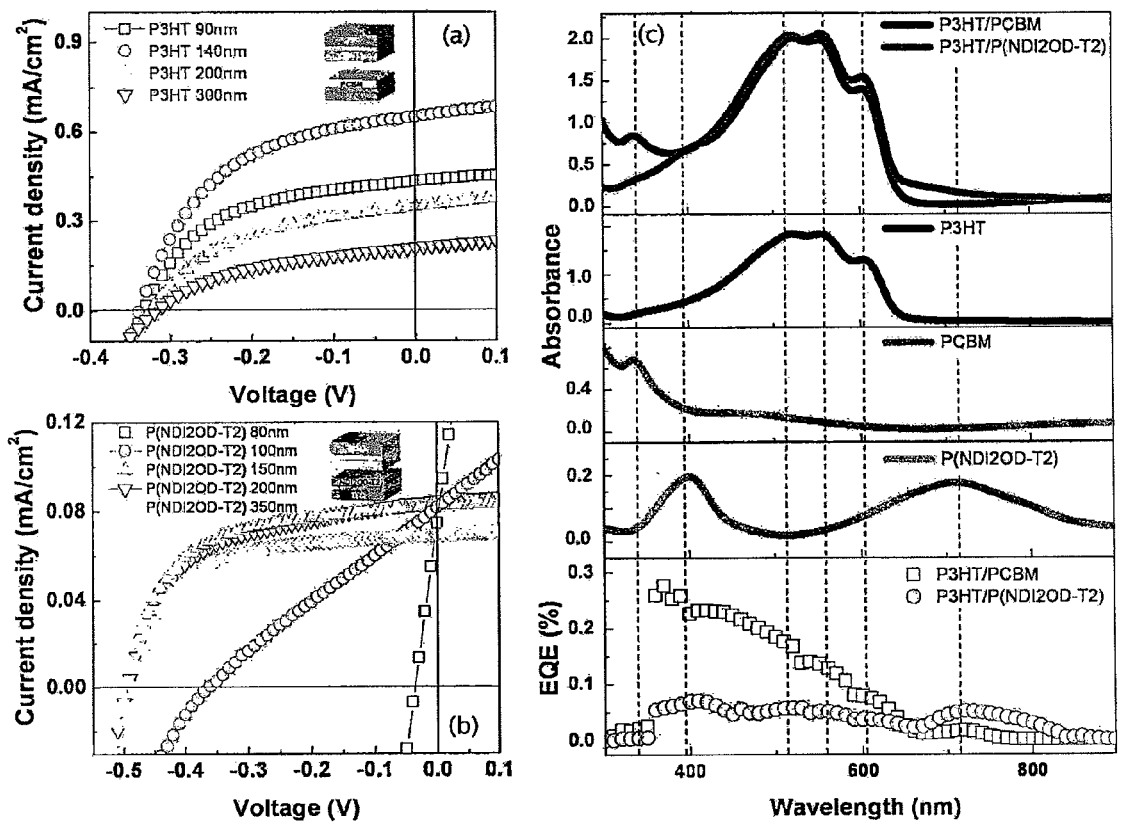
FIG. 4 illustrate J-V characteristics of laminated (a) P3HT/PCBM and (b) P3HT/P(NDI2OD-T2) bilayer organic solar cells with varying layer thicknesses. In (a), the PCBM layer thickness was kept constant at 40 nm. In (b), the P3HT layer thickness was kept constant at 200 nm. (c) From top to bottom: UV-vis-NIR spectra of bilayers of P3HT/PCBM (black; 200 and 40 nm, respectively) and P3HT/P(NDI2OD-T2) (red; 200 and 150 nm, respectively); and the spectra of the individual layers prior to lamination. Bottom graph consists of EQE spectra of laminated bilayer P3HT/PCBM (blue squares) and P3HT/P(NDI2OD-T2) (purple circles) polymer solar cells whose device characteristics are represented in green triangles in (a) and (b), and whose UV-vis spectra of active layers are shown in the top portion of the figure.
Figure 5:
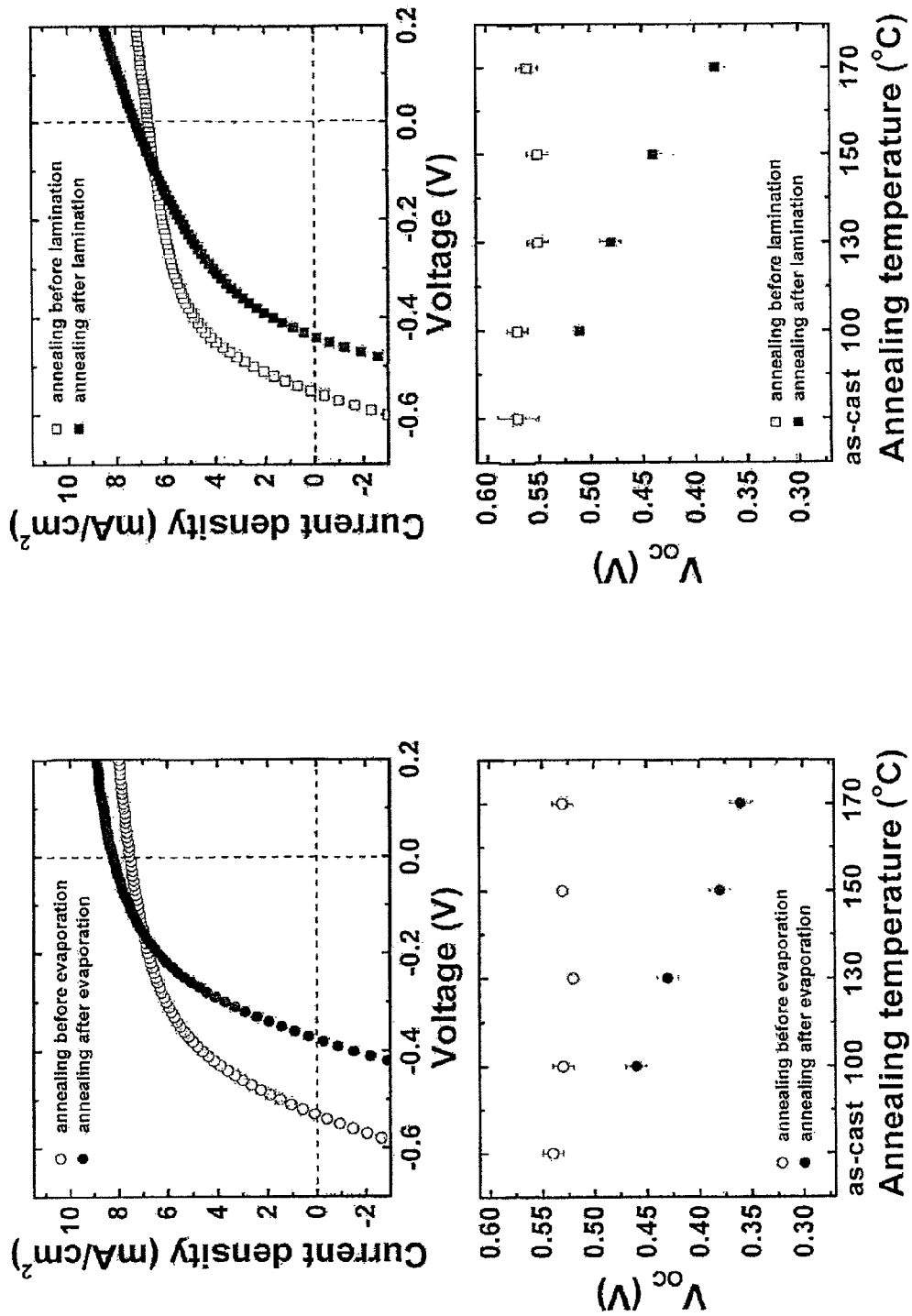
FIG. 5 illustrates the influence of the annealing sequence on device performance.
Figure 6:
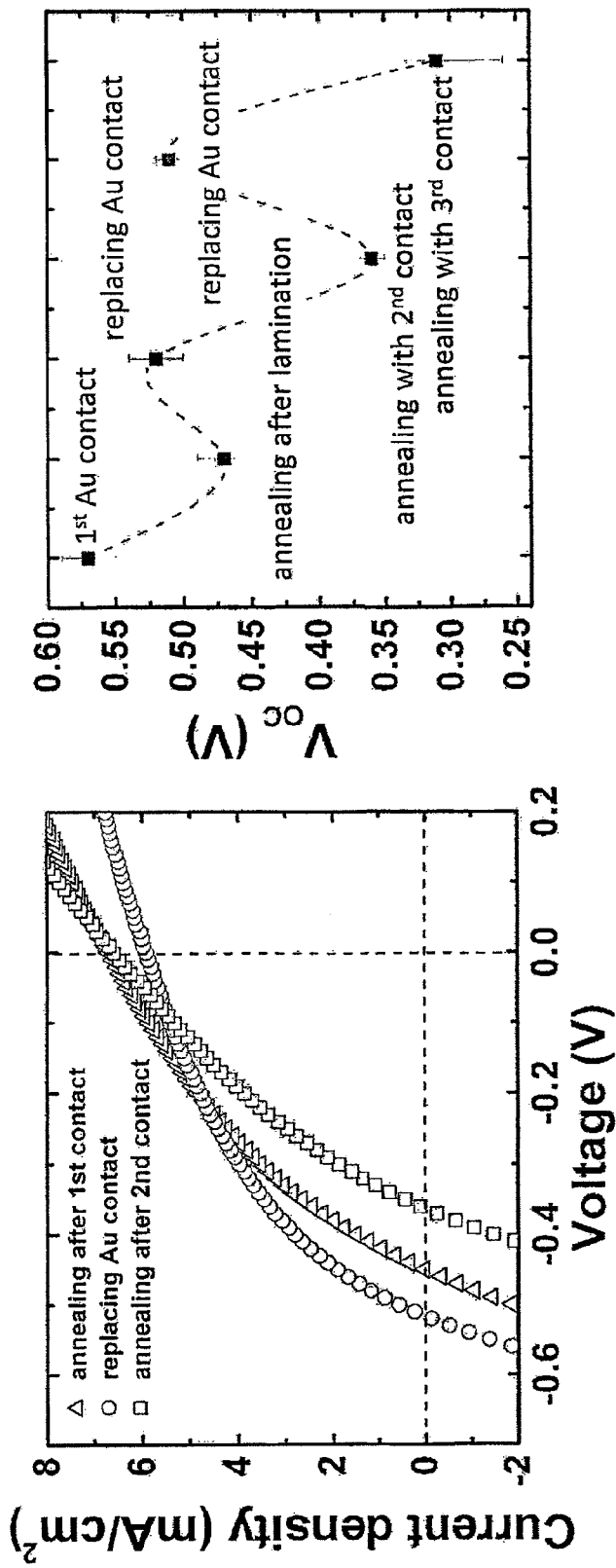
FIG. 6 illustrates the open-circuit voltage, $V_{OC}$, recovery with lamination of new electrodes.
Figure 7:
FIG. 7 is an exemplary sketch of soft contact lamination for organic solar cells with different annealing sequence.
Figure 9:
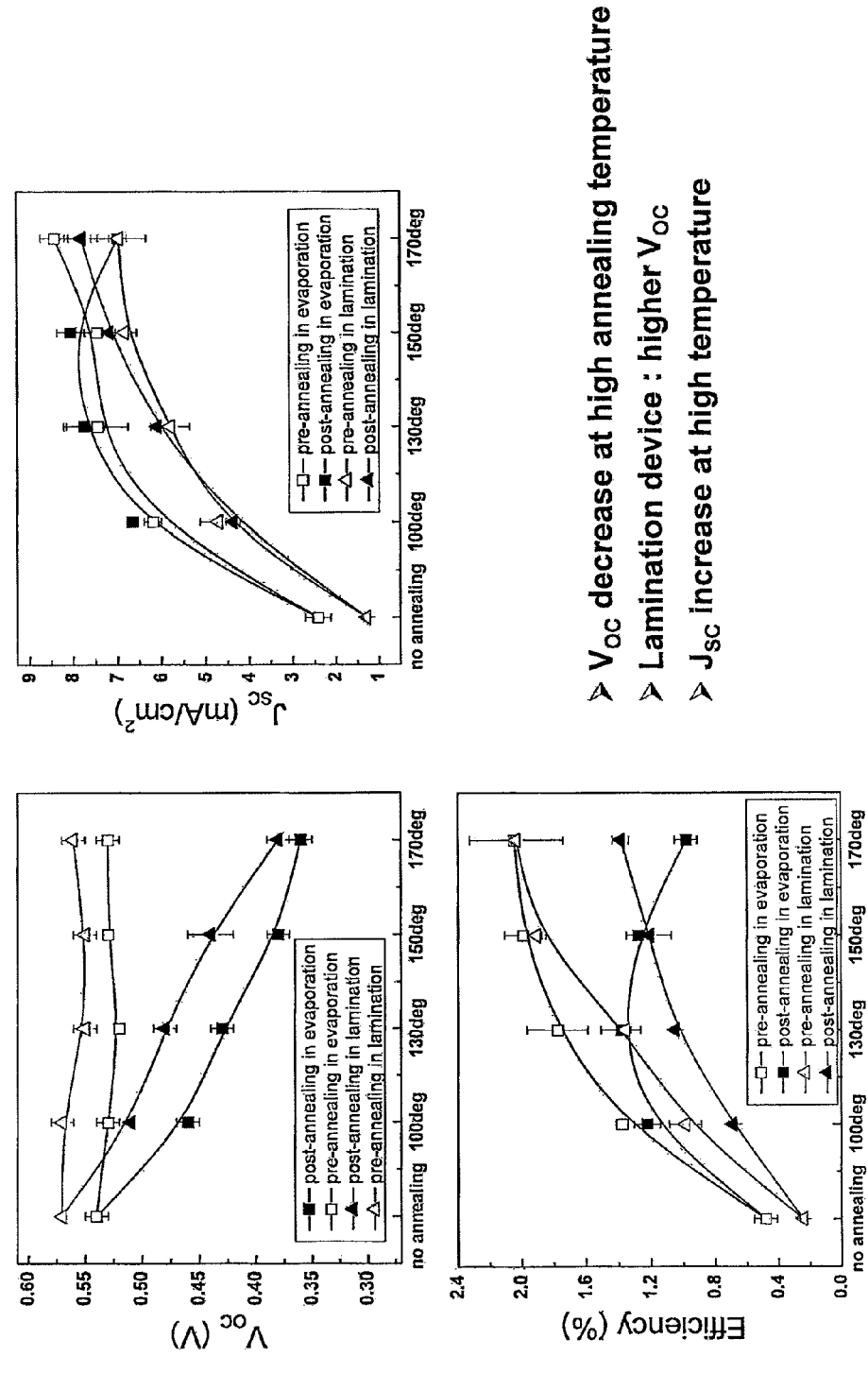
FIG. 9 illustrates the lamination and evaporation properties at various annealing temperatures.
Figure 10:
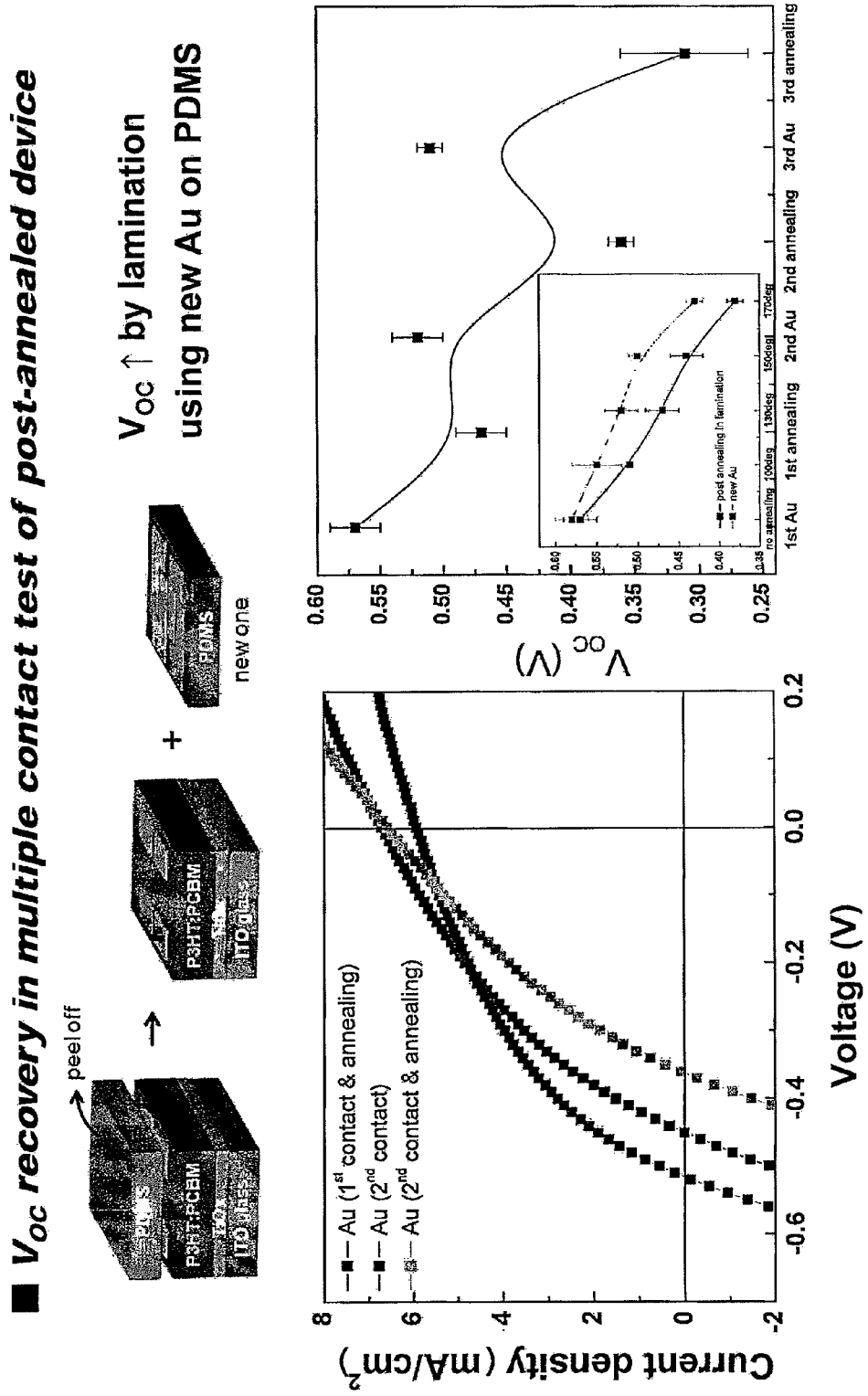
FIG. 10 illustrates the $V_{oc}$ recovery in multiple contact test of post-annealed device.
Figure 11:
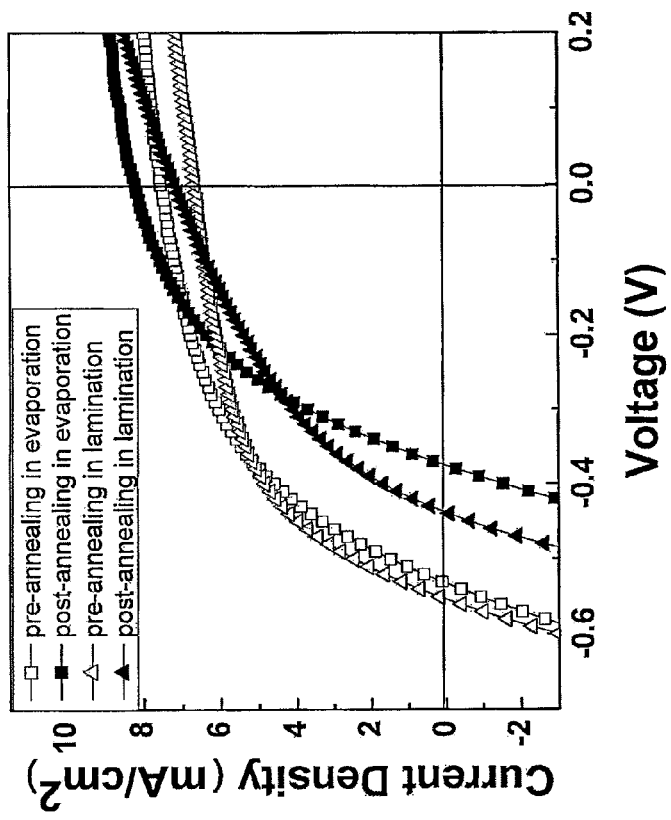
FIG. 11 illustrates J-V characteristics of a device made using a process that includes annealing at 150° C.

FIG. 4a contains the illuminated J-V characteristics of laminated bilayer/planar heterojunction organic solar cells comprising a 40 nm thick PCBM layer that was directly spin coated on the titania electron transport layer. P3HT of varying thickness (ranging from 90 to 300 nm) was first transferred onto elastomeric substrates with pre-deposited gold top electrodes per previously published procedures and then laminated against the electron acceptor to complete the organic solar cell. Specifically, P3HT was first spin coated from chlorobenzene on UV/Ozone treated glass. An elastomeric substrate, with evaporated top gold electrodes, was then brought into contact with P3HT and the entire assembly soaked in water for 5 min. During immersion, water selectively wicked into the P3HT/glass interface causing delamination of P3HT from the glass substrate and its transfer onto the elastomeric substrate. In FIG. 4a, it was observed that increasing P3HT thickness from 90 to 140 nm increased device $J_{sc}$ from 0.43 mA/cm² to 0.65 mA/cm². This increase in device $J_{sc}$ was attributed to enhanced light absorption with a thicker P3HT film.

Further increasing the thickness of P3HT, however, resulted in decreases in device $J_{sc}$, first to 0.35 mA/cm² at 200 nm P3HT and then to 0.21 mA/cm² at 300 nm P3HT. This decrease in device $J_{sc}$ was attributed to increases in the internal resistance of the device due to the limited hole mobility of P3HT. In this embodiment, there exists an optimal thickness for P3HT in inverted bilayer organic solar cells where the device characteristics were maximized. Quantification of the fill factor indicates the efficiency with which the disclosed devices operated. The laminated inverted bilayer devices described herein uniformly exhibited fill factors that were greater than 0.4, indicating efficient electrical contact at the laminated charge transfer interface.

The construction of bilayer organic solar cells by lamination was not limited to P3HT and PCBM. Inverted bilayer polymer solar cells comprising P3HT as the electron donor and P(NDI2OD-T2) as the electron acceptor were also fabricated by lamination of the donor material and acceptor materials to form a planar heterojuntion. FIG. 4b contains the J-V characteristics under light illumination of P3HT/P(NDI2OD-T2) bilayer polymer solar cellsat varying P(NDI2OD-T2) thickness; the P3HT layer thickness was kept constant at 200 nm for this experiment. When the P(NDI2OD-T2) layer was thin, the shunt resistance of the device was low, as manifested by the low fill factor exhibited by devices comprising P(NDI2OD-T2)<150 nm. When the P(NDI2OD-T2) layer was 150-200 nm, fill factors>0.55 were noticed. Further increasing the P(NDI2OD-T2) layer thickness, however, resulted in lowering of the device $J_{SC}$ from 0.082 mA/cm² to 0.069 mA/cm² due to an increase in the internal resistance of the P(NDI2OD-T2) layer.

The top graph of FIG. 4c contains the UV-vis-NIR absorption spectra of bilayers of P3HT/PCBM (200 and 40 nm, respectively) and P3HT/P(NDI2OD-T2) (200 and 150 nm, respectively). These layer thicknesses were chosen to simulate the active layers whose device characteristics are shown as green triangles in FIGS. 4a and 4b. The UV-vis-NIR spectra of the individual layers prior to lamination are also presented in FIG. 4c for comparison. It was observed that the UV-vis-NIR spectra of the bilayers appeared largely similar to that of P3HT, since P3HT is more efficient at absorbing light compared to the electron acceptors. Comparing the UV-vis-NIR spectra of the bilayers suggest that the efficiency with which light was absorbed was comparable for both materials pairs given the prescribed layer thicknesses. Given the similarity in the extent these planar donor-acceptor heterojunctions absorb light and given that P(NDI2OD-T2) was reported to have a higher electron mobility (0.45-0.85 cm²/Vsec) compared to PCBM, it was surprising that the $J_{sc}$ of the P3HT/P(NDI2OD-T2) bilayer device (green triangles; FIG. 4b) was almost 4 times lower than that of the P3HT/PCBM bilayer device (green triangles; FIG. 4a). The external quantum efficiency (EQE) spectra for both devices are shown in the bottom of FIG. 4c. Consistent with the device characteristics shown in FIGS. 4a and 4b, the maximum EQE of the P3HT/PDNI bilayer solar cell was approximately 4 times lower than that of the P3HT/PCBM bilayer device.

The specification and examples disclosed herein are intended to be considered as exemplary only, with a true scope and spirit of the invention being indicated in the following claims.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

What is claimed is:

1. A method for preparing a laminated organic photosensitive device having at least one photoactive donor-acceptor heterojunction, the method comprising:
   preparing an organic first portion comprising a first electrode by depositing at least one organic functional material directly onto a flexible substrate, a portion of the flexible substrate being treated to provide a deposition surface, the deposition surface being treated by exposing the portion of the flexible substrate to UV/ozone, the first electrode being deposited on the deposition surface;
   preparing an organic second portion over a second substrate, the organic second portion comprising at least one of a second electrode, an additional organic functional material, or both;
   wherein at least one processing step is performed on at least one of the first organic functional material, and the second organic portion to obtain desired properties prior to lamination; and
   laminating the first organic portion to the organic second portion to form a laminated organic solar cell.

2. The method of claim 1, wherein the flexible substrate of the organic first portion comprises an elastomer.

3. The method of claim 1, wherein at least one of the first and second electrodes comprises a metal chosen from Ti, Au, Al, and Ag, a metal oxide, a conducting polymer, a carbon nanotube containing material, or mixtures thereof.

4. The method of claim 1, wherein the second portion further comprises ITO on a glass or plastic substrate, wherein the substrate has been treated with UV/Ozone.

5. The method of claim 1, wherein the at least one second functional material comprises a photoactive donor-acceptor heterojunction comprised of small molecule materials, polymer materials, or mixtures thereof.

6. The method of claim 1, wherein the laminating is performed such that the interface between the first portion and the second portion is substantially free of air bubbles.

7. The method of claim 1, wherein the laminating is performed under ambient temperature with or without extraneous heat and/or pressure.

8. The method of claim 1, wherein the laminating is performed by annealing the second functional material at an appropriate temperature followed by lamination with the first electrode.

9. The method of claim 1, wherein the processing of the at least one functional material or at least one second functional material comprises a process chosen from thermal annealing and exposure to solvent vapors.

10. The method of claim 1, wherein at least two photoactive donor-acceptor heterojunctions are formed and wherein one of the first or second functional materials comprises a charge transfer layer, a charge recombination layer or a third electrode and connects the at least two photoactive donor-acceptor heterojunctions to form a tandem organic solar cell.

11. The method of claim 2, wherein the elastomer comprises polydimethylsiloxane (PDMS).

12. The method of claim 11, wherein the PDMS is in the form of a pad that is prepared by mixing a PDMS prepolymer and a curing agent.

13. The method of claim 5, wherein the second functional material comprises poly(3-hexylthiophene), [6,6]-phenyl-C61-butyric acid methyl ester, and poly{[n,n'-bis(2-octyldodecyl)-naphthalene-1,4,5,8-bis(dicarboximide)-2,6-diyl]-alt-5,5'-(2,2'-bithiophene)}, or mixtures thereof, and wherein the second functional material is deposited over a titanium electron transport layer.

14. The method of claim 13, wherein the second functional material comprises poly(3-hexylthiophene)/[6,6]-phenyl-C61-butyric acid methyl ester and poly(3-hexylthiophene)/poly{[n,n'-bis(2-octyldodecyl)-naphthale-ne-1,4,5,8-bis(dicarboximide)-2,6-diyl]-alt-5,5-(2,2'-bithiophene)}.

15. The method of claim 14, further comprising electrical contacts chosen from Ag or Au.

16. A method for preparing a laminated organic photosensitive device, the method comprising at least one photoactive donor-acceptor heterojunction comprising:
providing a first substrate comprising an elastomeric material;
depositing at least one conducting material directly onto the elastomeric material to form a first organic portion comprising at least one first electrode, at least a portion of the first substrate being treated to provide a deposition surface, the deposition surface being treated by exposing the portion of the first substrate to UV/ozone, the first electrode being deposited on the deposition surface;
providing a second substrate;
depositing at least one functional material on the second substrate to form a second organic portion;
optionally processing the second organic portion with at least one pre-lamination step; and
laminating the first organic portion with the second organic portion to form an organic solar cell.

17. The method of claim 16, wherein the laminating is performed under ambient temperature with or without extraneous pressure.

18. The method of claim 16, wherein the elastomer comprises polydimethylsiloxane (PDMS).

19. The method of claim 16, wherein the at least one conducting material comprises a metal chosen from Ti, Au, Al, and Ag, a metal oxide, a conducting polymer, a carbon nanotube containing material, or mixtures thereof.

20. The method of claim 16, wherein the at least one conducting material comprises indium tin oxide.

21. The method of claim 16, wherein the at least one functional material comprises small molecules, polymers, or mixtures thereof.

22. The method of claim 16, further comprising optional processing of the first portion and/or the second portion by thermal annealing, exposure to solvent vapors, or combinations thereof.

23. The method of claim 21, wherein the donor-acceptor heterojunction comprises:
poly(3-hexylthiophene)/[6,6]-phenyl-C61-butyric acid methyl ester;
poly(3-hexylthiophene)/poly{[n,n'-bis(2-octyldodecyl)-naphthalene-1,4,5,8-bis(dicarboximide)-2,6-diyl]-alt-5,5'-(2,2'-bithiophene)}; or
combinations thereof.

24. A method for preparing a laminated organic photosensitive device comprising at least one photoactive donor-acceptor heterojunction, the method comprising,
preparing a first organic portion, the method comprising:
providing a PDMS substrate prepared from mixing PDMS pre-polymer and a curing agent;
exposing the PDMS substrate to UV/ozone to provide a deposition surface;
depositing at least one conducting material chosen from Ti and Au directly onto the deposition surface;
preparing a second organic portion comprising:
poly(3-hexylthiophene)/[6,6]-phenyl-C61-butyric acid methyl ester or
poly(3-hexylthiophene)/poly{[n,n'-bis(2-octyldodecyl)-naphthalen-e-1,4,5,8-bis(dicarboximide)-2,6-diyl]-alt-5,5'-(2,2'-bithiophene)}, and electrical contacts chosen from Ag or Au; and
coupling the PDMS pad of the first portion with the second portion under ambient temperature with or without extraneous pressure, wherein the coupling is performed such that the interface between the PDMS pad and the second portion is substantially free from air bubbles forming an organic solar cell.

25. A method for preparing a tandem photosensitive device, the method comprising: preparing at least one first photosensitive device comprising:
preparing at least one first photosensitive device comprising, providing a first substrate comprising an elastomeric material;
depositing at least one conducting material on the elastomeric material to form a first portion comprising a first electrode, a portion of the first substrate being treated to provide a deposition surface, the deposition surface being treated by exposing the portion of the first substrate to UV/ozone, the first electrode being deposited on the deposition surface;
providing a second substrate;
depositing a functional material, such as one that forms a photoactive layer, on the second substrate to form a second portion;
optionally processing the second portion with at least one pre-lamination step;
coupling the first portion comprising a first electrode with the second portion to form the first photosensitive device; and
preparing at least one second photosensitive device comprising, providing a third substrate comprising an elastomeric material;
depositing at least one conducting material on the elastomeric material to form a third portion comprising a third electrode;
optionally processing the third electrode with at least one pre-lamination treatment step;
providing a fourth substrate;
depositing a photoactive material on the fourth substrate to form a fourth portion;
optionally processing the fourth portion with at least one pre-lamination step;
coupling the third portion with the fourth portion to form a second photosensitive device, wherein the coupling conditions for the first portions and the second portions of the first photosensitive device and the third portions and fourth portions of the second photosensitive device may be the same or different; and
coupling the first photosensitive device with the second photosensitive device.

26. A method for preparing a laminated organic photosensitive device having at least one photoactive donor-acceptor heterojunction, the method comprising:

preparing an organic first portion comprising a first electrode by depositing at least one organic functional material directly onto a flexible substrate;
preparing an organic second portion over a second substrate, the second substrate being treated with UV/Ozone, the organic second portion comprising at least one of a second electrode, an additional organic functional material, or both;
laminating the organic first portion to the organic second portion to form a laminated organic solar cell.

27. A method for preparing a laminated organic photosensitive device, the method comprising at least one photoactive donor-acceptor heterojunction comprising:
providing a first substrate comprising an elastomeric material;
depositing at least one conducting material directly onto the elastomeric material to form a first organic portion comprising at least one first electrode;
optionally processing the first portion comprising at least one first electrode with at least one pre-lamination treatment step;
providing a second substrate;
treating the second substrate with UV/Ozone;
depositing at least one functional material on the second substrate to form a second organic portion;
laminating the organic first portion with the second organic portion to form an organic solar cell.

* * * * *